United States Patent
Gonzalez

(10) Patent No.: US 10,032,497 B2
(45) Date of Patent: Jul. 24, 2018

(54) FLEXIBLE POINT-TO-POINT MEMORY TOPOLOGY

(71) Applicant: Integrated Device Technology, Inc., San Jose, CA (US)

(72) Inventor: Alejandro F. Gonzalez, Johns Creek, GA (US)

(73) Assignee: INTEGRATED DEVICE TECHNOLOGY, INC., San Jose, CA (US)

(*) Notice: Subject to any disclaimer, the term of this patent is extended or adjusted under 35 U.S.C. 154(b) by 0 days.

(21) Appl. No.: 15/090,818

(22) Filed: Apr. 5, 2016

(65) Prior Publication Data

US 2017/0287538 A1    Oct. 5, 2017

(51) Int. Cl.
G11C 7/10 (2006.01)
G11C 7/22 (2006.01)
G11C 7/12 (2006.01)
G06F 13/40 (2006.01)

(52) U.S. Cl.
CPC ............... *G11C 7/222* (2013.01); *G11C 7/12* (2013.01); *G06F 13/40* (2013.01); *G11C 7/1078* (2013.01)

(58) Field of Classification Search
CPC ......... G11C 7/222; G11C 7/12; G11C 7/1078; G06F 13/40
USPC ................................................... 365/189.05
See application file for complete search history.

(56) References Cited

U.S. PATENT DOCUMENTS

| | | | | |
|---|---|---|---|---|
| 2008/0027697 | A1* | 1/2008 | Rajan | G11C 7/10 703/14 |
| 2010/0005218 | A1* | 1/2010 | Gower | G06F 13/4234 711/5 |
| 2010/0005220 | A1* | 1/2010 | Loughner | G06F 13/426 711/5 |
| 2013/0254495 | A1* | 9/2013 | Kim | G06F 13/1663 711/150 |
| 2016/0293239 | A1* | 10/2016 | Giovannini | G11C 29/44 |

* cited by examiner

*Primary Examiner* — Jason Lappas
(74) *Attorney, Agent, or Firm* — Christopher P. Maiorana, PC

(57) ABSTRACT

An apparatus includes a plurality of memory devices and a control circuit. The control circuit may be configured to enable a plurality of access modes for the plurality of memory devices. In a one-channel mode, all of the memory devices are accessed using a single selectable channel. In a two-channel mode, a first portion of the plurality of memory devices is accessed using a first channel and a second portion of the plurality of memory devices is accessed using a second channel.

20 Claims, 12 Drawing Sheets

US 10,032,497 B2

FLEXIBLE POINT-TO-POINT MEMORY TOPOLOGY

FIELD OF THE INVENTION

The present invention relates to memory generally and, more particularly, to a method and/or apparatus for implementing a flexible point-to-point memory topology.

BACKGROUND OF THE INVENTION

Several types of memory modes are used on conventional motherboards, depending on how many dual inline memory modules (DIMMs) are installed. A single-channel (asymmetric) mode provides single-channel bandwidth operations when only one DIMM is installed or when the memory capacities of more than one DIMM are unequal. A dual-channel (interleaved) mode offers higher memory throughput and is enabled when the memory capacities of both channels are equal. A triple-channel mode provides triple-channel interleaving, which can reduce overall memory latency by accessing the DIMM memory sequentially. A quad-channel mode can be enabled when four (or multiples of four) DIMMs with identical capacity and speed are installed. Regardless of the memory mode used, each DIMM can operate only on a single channel.

Communication between the DIMMs and the motherboard can be done using differential uni-directional signaling or single-ended bidirectional signaling. When differential uni-directional signaling is used, more pins are needed to meet capacity demands for a given memory technology node, resulting in higher cost. Scaling capacity in point-to-point configurations has a direct impact on bandwidth. This is a disadvantage with respect to fly-by topologies where the bandwidth is constant for one DIMM or Many DIMMs. However, existing technology (channels, I/O's, etc.) are capable of running double data rate (DDR) data (DQ) signals at significantly higher data rates in point-to-point topologies.

It would be desirable to implement a flexible point-to-point memory topology.

SUMMARY OF THE INVENTION

The present invention concerns an apparatus including a plurality of memory devices and a control circuit. The control circuit may be configured to enable a plurality of access modes for the plurality of memory devices. In a one-channel mode, all of the memory devices are accessed using a single selectable channel. In a two-channel mode, a first portion of the plurality of memory devices is accessed using a first channel and a second portion of the plurality of memory devices is accessed using a second channel.

BRIEF DESCRIPTION OF THE DRAWINGS

Embodiments of the invention will be apparent from the following detailed description and the appended claims and drawings in which:

DETAILED DESCRIPTION OF THE PREFERRED EMBODIMENTS

Embodiments of the invention include providing a method and/or apparatus for implementing a flexible point-to-point memory topology that may (i) keep signals point-to-point, (ii) reduce signal line loading to enable faster speeds, (iii) use longer burst lengths, (iv) send commands in multiple cycles, (v) reduce command/address signals, (vi) reduce pin count, (vii) utilize duplex registered clock drivers and duplex data buffers, (viii) provide multi-channel bandwidth with one or more memory modules installed, (ix) allow a single memory module to service two channels independently, and/or (x) be implemented as one or more integrated circuits.

Figure 1:
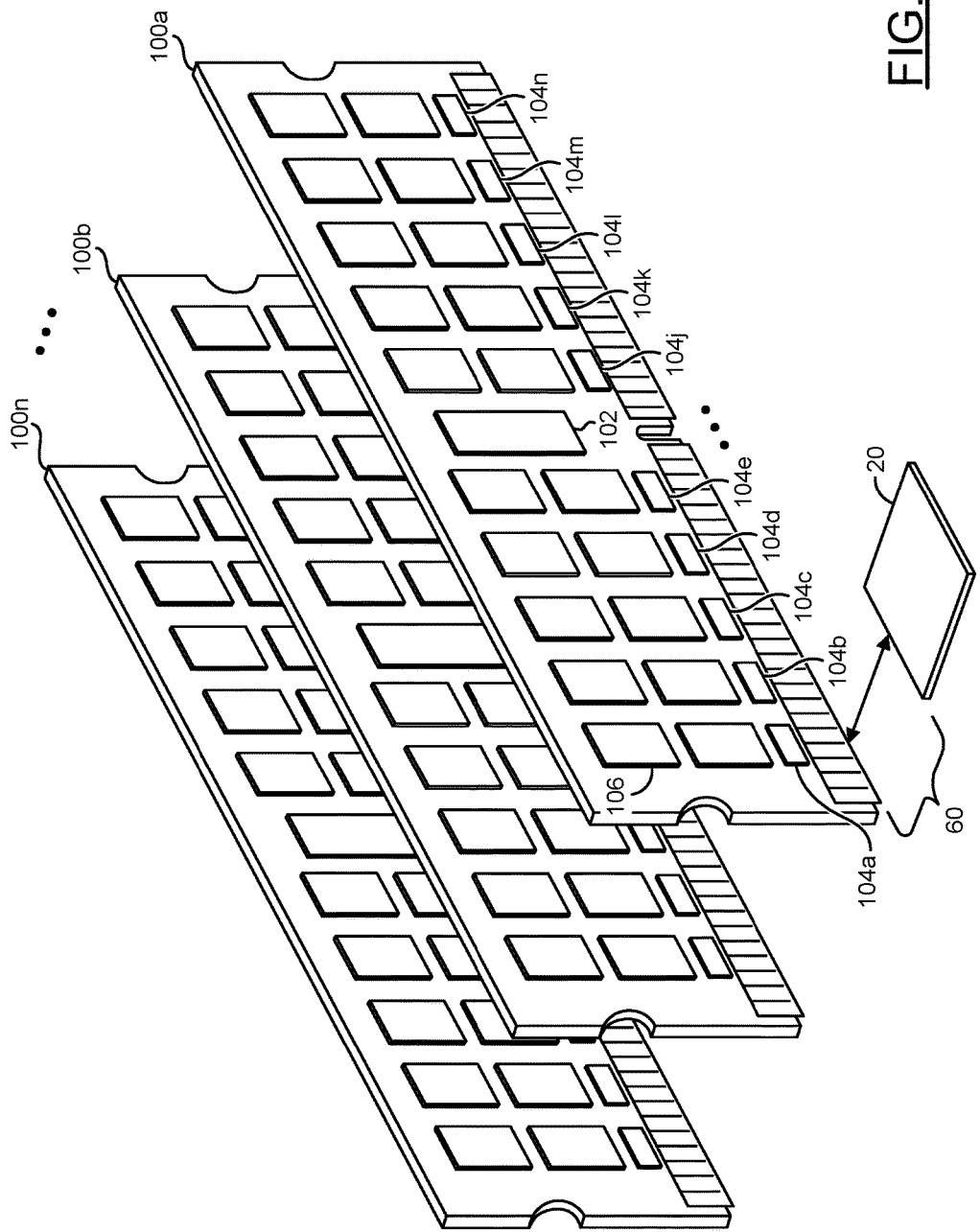
FIG. 1 is a diagram illustrating a memory system populated using dual-inline-memory modules (DIMMs) in accordance with an example embodiment of the invention.

Referring to FIG. 1, a diagram of a memory system is shown in accordance with an embodiment of the present invention. In an example, circuits 100a-100n may be implemented as memory modules (or boards). For example, the memory modules 100a-100n may be implemented as dual in-line memory modules (DIMMs). In some embodiments, the memory modules 100a-100n may be implemented as double data rate fourth generation (DDR4) dual in-line memory modules (DIMMs). The memory modules 100a-100n may comprise a block (or circuit) 102, a number of blocks (or circuits) 104a-104n, a plurality of memory devices 106, and/or various other blocks, circuits, pins, connectors and/or traces. The circuit 102 may be implemented as a duplex registered clock driver (RCD). In an example, the duplex RCD circuit 102 may be implemented as a duplex DDR4 RCD circuit. The circuits 104a-104n may be configured as duplex data buffers. In an example, the memory devices 106 may be implemented a synchronous dynamic random access memory (SDRAM) devices. The type, arrangement and/or number of components of the memory modules 100a-100n may be varied to meet the design criteria of a particular implementation.

The memory modules 100a-100n are shown connected to a block (or circuit) 20. The circuit 20 may implement a memory controller. The memory controller 20 may be located in another device, such as a computing engine. Various connectors/pins/traces 60 may be implemented to connect the memory modules 100a-100n to the memory controller 20. In some embodiments, the connectors/pins/traces 60 may comprise a 288-pin configuration. In an example, the memory controller 20 may be a component on a computer motherboard. In another example, the memory controller 20 may be a component of a microprocessor. In yet another example, the memory controller 20 may be a component of a central processing unit (CPU).

In an example, some of the connectors/pins/traces 60 may be part of the memory modules 100a-100n and some of the connectors/pins/traces 60 may be part of the motherboard and/or memory controller 20. The memory modules 100a-100n may be connected to a computer motherboard (e.g., by pins, traces and/or connectors 60) to transfer data between components of a computing device and the memory modules 100a-100n. The motherboard topology and number of memory modules 100a-100n installed generally determines whether the memory modules 100a-100n may operate in a single(one)-channel mode or a two-channel mode. In the two-channel mode, the slot in which the particular memory modules 100a-100n are installed may determine a particular configuration of each memory module when operating in the single-channel mode (e.g., described in more detail below in connection with FIGS. 9A-9C). In an example, the memory controller 20 may be implemented on a northbridge of a motherboard and/or as a component of a microprocessor (e.g., an Intel CPU, an AMD CPU, an ARM CPU, etc.). The implementation of the memory controller 20 may be varied according to the design criteria of a particular implementation.

In various embodiments, the memory modules 100a-100n may implement DDR4 SDRAM memory modules. In an example, the DDR4 SDRAM memory modules 100a-100n may have a memory module density of 512 gigabyte (GB), one terabyte (TB), or higher per module (e.g., compared to 128 GB per dual in-line memory module (DIMM) in DDR3). The DDR4 SDRAM memory modules 100a-100n may operate at voltages of 1.2-1.35 volts (V) with a frequency between 800-1600 megahertz (MHZ) (e.g., compared to 1.5-1.65V at frequencies between 400-1067 MHz in DDR3). In some embodiments, the memory modules 100a-100n may be implemented as low voltage memory and operate at 1.05V. For example, the low voltage embodiments of the memory modules 100a-100n may implement 35% power savings compared to DDR3 memory. The DDR4 SDRAM memory modules 100a-100n may transfer data at speeds of 2.13-4.26 giga-transfers per second (GT/s) and higher (e.g., compared to 0.8-2.13 GT/s in DDR3). The operating parameters of the memory modules 100a-100n may be varied according to the design criteria of a particular implementation.

In an example, the memory modules 100a-100n may be compliant with the DDR4 specification titled "DDR4 SDRAM", specification JESD79-4A, November 2013, published by the Joint Electron Device Engineering Council (JEDEC) Solid State Technology Association, Arlington, Va. Appropriate sections of the DDR4 specification are hereby incorporated by reference in their entirety.

The memory modules 100a-100n may be implemented as DDR4 load reduced DIMMs (LRDIMMs). The duplex data buffers 104a-104n may allow the memory modules 100a-100n in a DDR4 LRDIMM configuration to operate at higher bandwidth and/or at higher capacities compared to DDR4 RDIMM (e.g., 2400 or 2666 MT/s for DDR4 LRDIMM compared to 2133 or 2400 MT/s for DDR4 RDIMM at 384 GB capacity). For example, compared to DDR4 RDIMM configurations, the DDR4 LRDIMM configuration of the memory modules 100a-100n may allow improved signal integrity on data signals, and/or better intelligence and/or post-buffer awareness by the memory controller 20.

Figure 2:
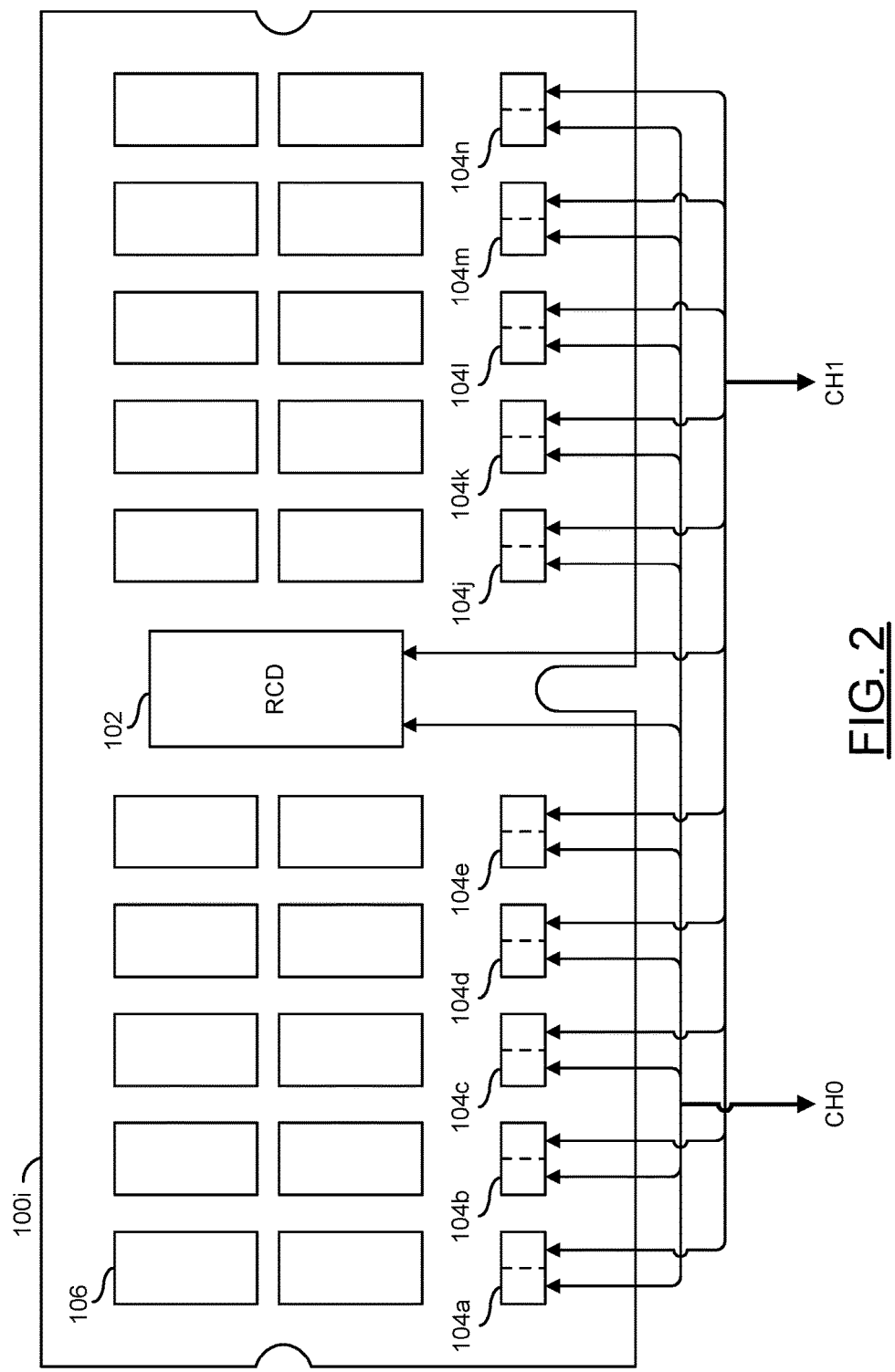
FIG. 2 is a diagram illustrating a two-channel mode of a dual-in-line-memory module (DIMM) in accordance with an example embodiment of the invention.

Referring to FIG. 2, a diagram of a memory module 100i is shown illustrating a two channel mode of a dual-in-line-memory module (DIMM) in accordance with an example embodiment of the invention. The memory module 100i may be representative of the memory modules 100a-100n. The memory module 100i is shown operating in a two-channel mode in accordance with an example embodiment of the invention. In the two-channel mode, the memory module 100i is configured to service two channels (e.g., CH0 and CH1) independently.

In an example, the memory module 100i may comprise two rows (e.g., lower and upper) of five memory devices 106 on either side of the duplex RCD circuit 102. A row of five duplex data buffers 104a-104e may be located below the two rows of memory devices 106 on the left side of the duplex RCD circuit 102. Another row of five duplex data buffers 104f-104n may be located below the two rows of memory devices 106 on the right side of the duplex RCD circuit 102. Each of the duplex data buffers 104a-104n may be configured to support two memory channels by implementing two data paths with the respective memory devices 106 located directly above. A first memory channel and data path of each duplex data buffer 104a-104n may communicate with the respective memory device(s) 106 in the lower row. A second memory channel and data path of each duplex data buffer 104a-104n may communicate with the respective memory device(s) 106 in the upper row.

In some embodiments, the memory devices 106 may be physically located on both sides (e.g., the front and back) of the circuit board of the memory module 100i. When the memory devices 106 are located on both sides of the memory module 100i, the first channel and data path of each duplex data buffer 104a-104n communicate with the memory devices 106 in the lower row on both the front and back sides and the second channel and data path of each duplex data buffer 104a-104n communicate with the memory devices 106 in the upper row on both the front and back sides. A capacity of memory on the memory module 100i may be varied according to the design criteria of a particular implementation. In an example where the memory module 100i is implemented as a DDP memory module, each memory channel/data path may communicate with two rows of memory devices 106.

Figure 3:
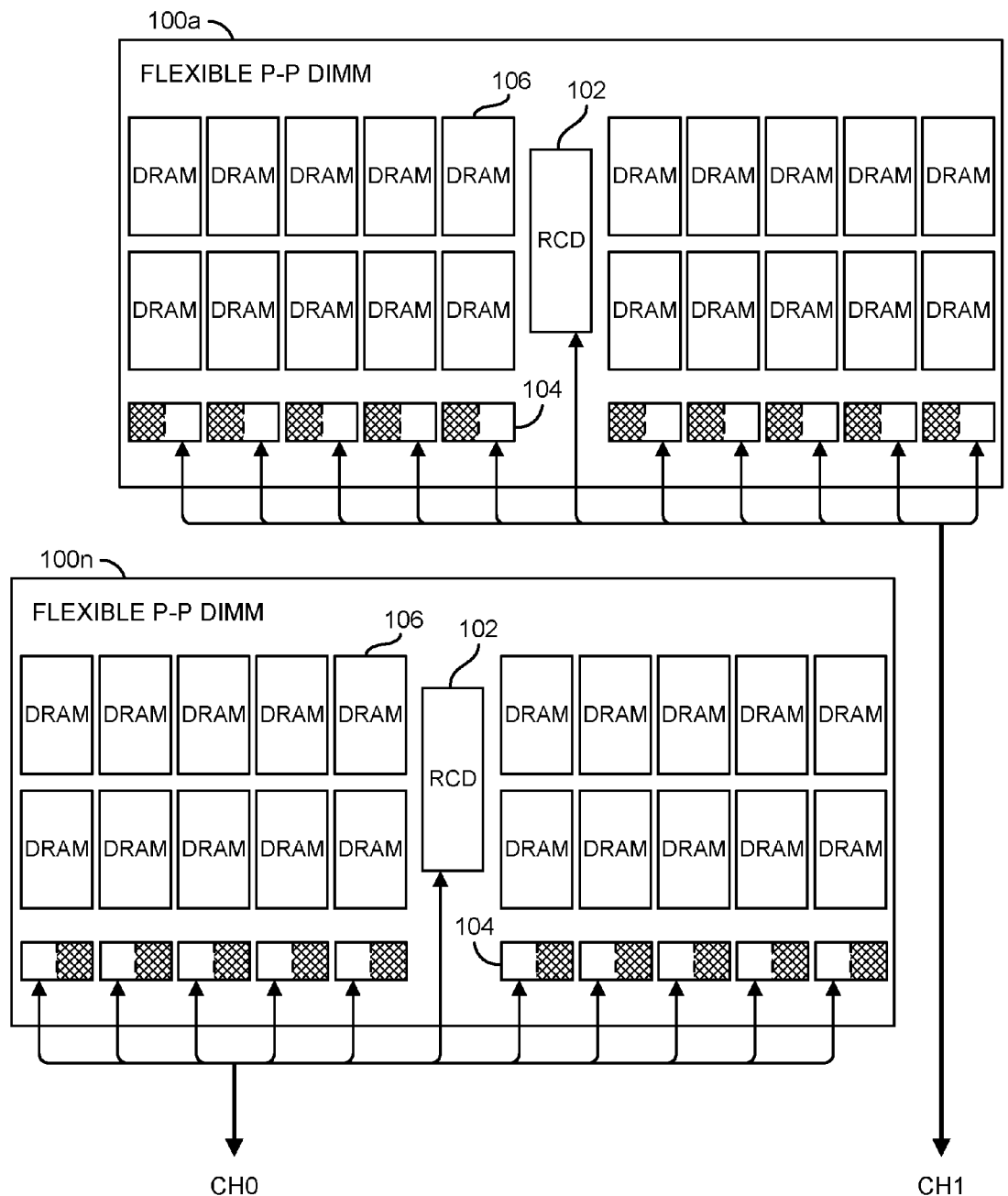
FIG. 3 is a diagram illustrating a single-channel modes of a dual-in-line-memory module (DIMM) in accordance with an example embodiment of the invention.

Referring to FIG. 3, a diagram is shown illustrating two dual-in-line-memory modules (DIMMs) operating in a single-channel mode in accordance with an example embodiment of the invention. In the single-channel mode, each memory module 100i is configured to service a particular channel (e.g., either CH0 or CH1) dependent upon the slot in which the memory module 100i is installed. When multiple memory modules 100a-100n are installed in a system, each of the memory modules 100a-100n may be configured to communicate using a separate channel. For example, in a system with two memory modules installed, a module 100a may be configured to communicate with the memory controller 20 using memory channel 1 (CH1) and a memory module 100n may be configured to communicate with the memory controller 20 using memory channel 0 (CH0).

When the memory modules 100a-100n are configured for single channel operation, a particular channel used to communicate is connected to one side of the duplex RCD circuit 102 and one side of each of the duplex data buffers 104a-

104n (104). The unused portions of the data buffers 104 are placed in an idle state (e.g., indicated by cross hatching). For example, FIG. 3 shows the memory module 100a having the memory channel CH1 connected to the right hand data port of the duplex data buffers 104, while the left hand data portions of the duplex data buffers 104 are idle. Command, address, and control signals of the memory channel CH1 are presented to the right hand control port of the duplex RCD circuit 102. For the memory module 100n, signals related to the memory channel CH0 are presented to the left hand side (portion) of the duplex data buffers 104 and to the left hand control port of the duplex RCD circuit 102. The right hand side (portion) of the duplex data buffers 104 are set to the idle state (e.g., indicated by cross hatching). In general, the memory controller 20 is responsible for programming the memory modules 100a-100n for the appropriate configuration to match the memory topology of the motherboard.

Figure 4:
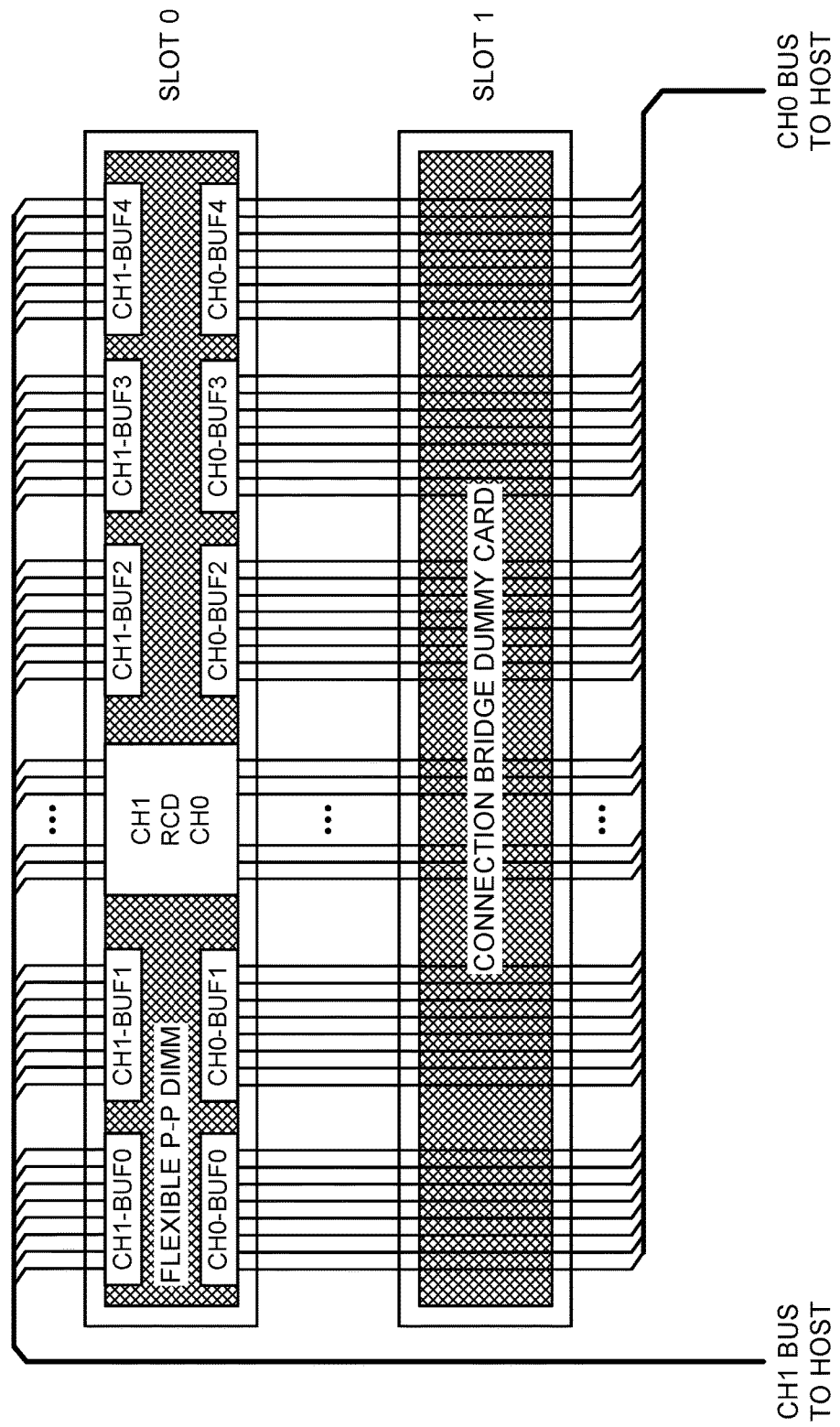
FIG. 4 is a diagram illustrating system memory slots populated by a dual-in-line-memory module (DIMM) operating in the two-channel mode and a bridge card.

Referring to FIG. 4, a diagram is shown illustrating a motherboard of a system with two memory slots populated by a single dual-in-line-memory module (DIMM) operating in the two channel mode and a bridge card. In one example, a single memory module in accordance with an example embodiment of the invention may be plugged into a slot 0 socket and a connection bridge dummy card may be plugged into a slot 1 socket. The memory module would be configured to operate in the two channel mode. The channel 1 bus to/from the host connects to one side of the slot 0 socket which is connected to the channel 1 portion of the duplex data buffers 104a-104n and the duplex RCD circuit 102. For clarity, the channel portions of the duplex data buffers 104a-104n are represented by separate blocks (e.g., BUF0-BUF4) adjacent to respective edges of the slot 0 socket. The channel 0 bus to/from the host connects to one side of the slot 1 socket. The connection bridge dummy card in slot 1 would pass the signals connected to the slot 1 socket to/from the channel 0 bus across to the slot 0 socket for connection to the channel 0 side of the duplex data buffers 104a-104n and the channel 0 control port of the duplex RCD circuit 102.

Figure 5:
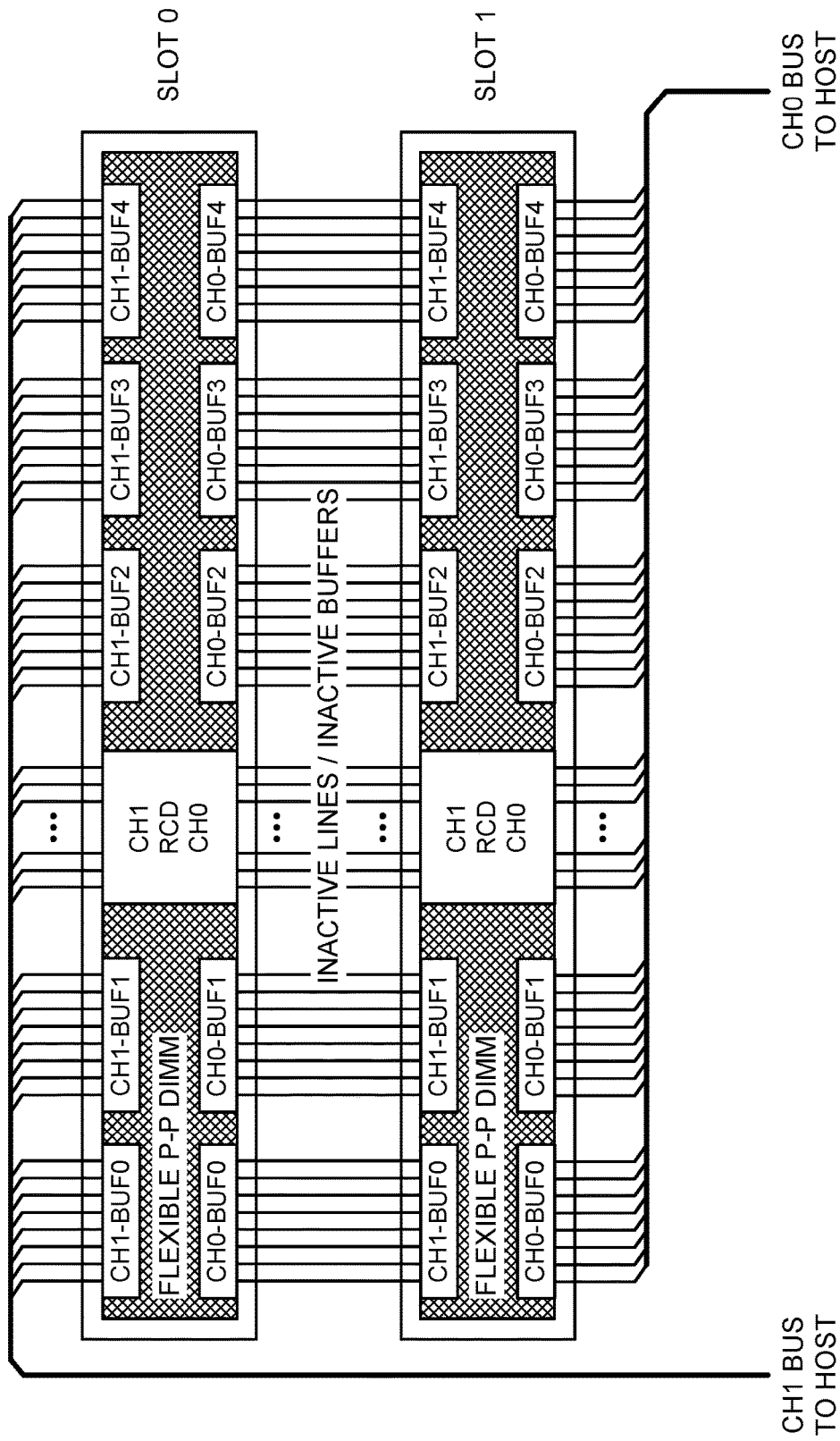
FIG. 5 is a diagram illustrating system memory slots populated by dual-in-line-memory modules (DIMMs) operating in the single-channel modes.

Referring to FIG. 5, a diagram is shown illustrating the motherboard of the system with memory slots populated by two dual-in-line-memory modules (DIMMs), each operating in a respective one of the single channel modes. A first memory module is installed in slot 0 and a second memory module is installed in slot 1. Each of the memory modules are configured for single channel operation.

The memory module in slot 0 would receive channel 1 bus signals at the channel 1 side of the duplex data buffers 104a-104n and the channel 1 control port of the duplex RCD circuit 102. The channel 0 duplex data buffer inputs and channel 0 control inputs of the duplex RCD circuit 102 would be connected to inactive lines and would be set into the idle state. The memory module in slot 1 would receive channel 0 bus signals at the channel 0 portion of the duplex data buffers and the channel 0 side of the duplex RCD circuit 102. The channel 1 portion of the duplex data buffers would be in the idle state and connected with the inactive lines.

Figure 6:
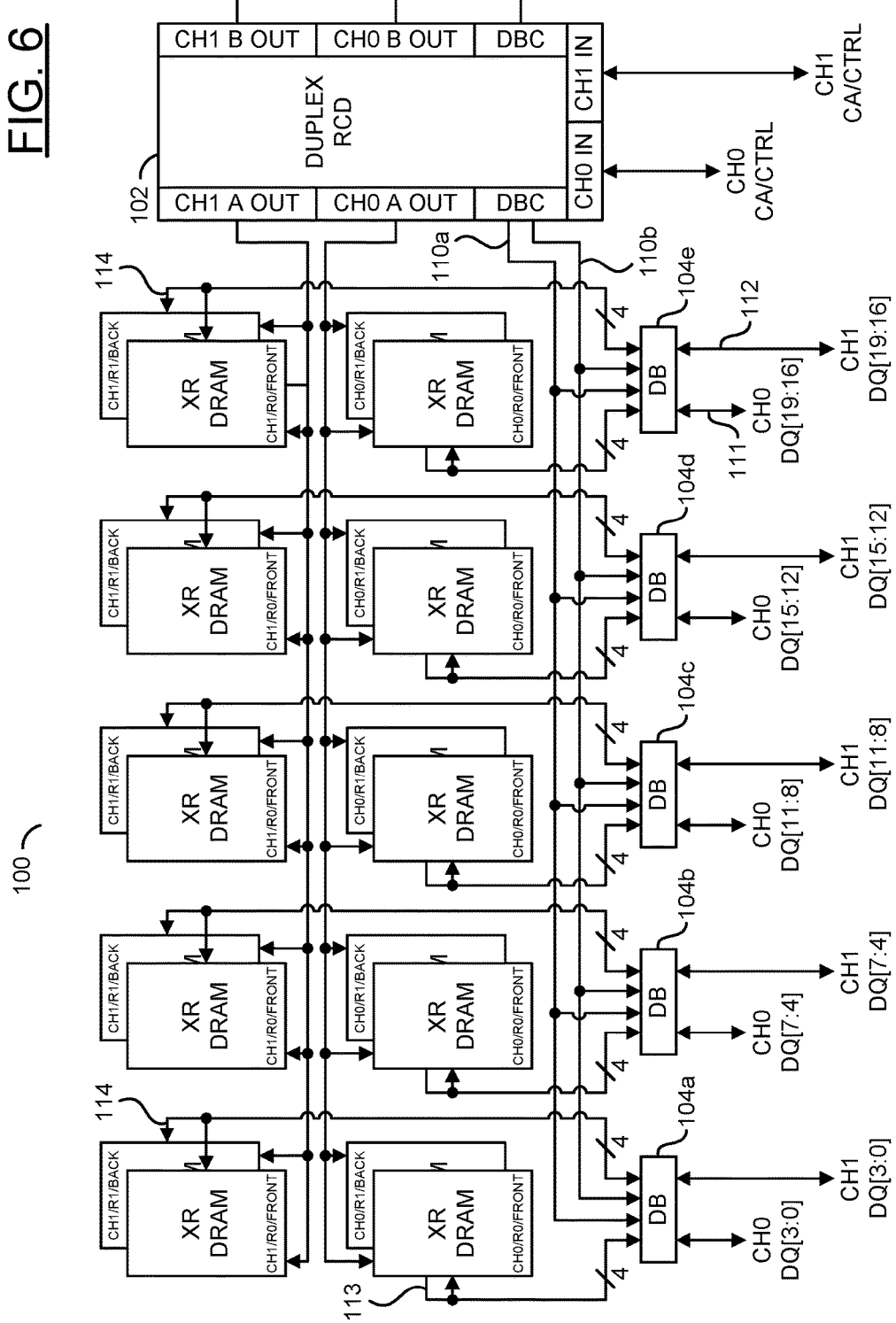
FIG. 6 is a diagram illustrating various communication buses of a dual-in-line-memory module (DIMM) in accordance with an example embodiment of the invention.

Referring to FIG. 6, a diagram is shown illustrating various communication buses of a dual-in-line-memory module (DIMM) in accordance with an example embodiment of the invention. Only the left hand side portion of a memory module 100 is illustrated for clarity. The right hand side portion is generally a mirror image of the left hand side. The memory controller 20 (not shown for clarity) may be configured to operate with two memory channels (e.g., CH0 and CH1). Each of the channels CH0 and CH1 may comprise a signal (e.g., CLK) and a number of control and address signals (e.g., ADDR/CMD), collectively annotated as CA/CTRL. When the memory module 100 is operating in the two-channel mode, the signals CA/CTRL of each of the channels CH0 and CH1 may be presented to respective ports of the duplex RCD circuit 102. The memory controller 20 may generate and/or receive data signals (e.g., DQa-DQn) associated with each channel CH0 and CH1 that may be presented/received to/from respective channel ports (e.g., a port 111 and a port 112, respectively) of each of the duplex data buffers 104a-104n.

The duplex RCD circuit 102 may be configured to communicate with the memory controller 20, memory devices 106, and the duplex data buffers 104a-104n. The memory devices 106 may be arranged in rows on the front and back of the memory module 100. The rows of memory devices 106 on the front side may be designated as rank 0. The rows of memory devices 106 on the back side may be designated as rank 1. The duplex RCD circuit 102 may decode instructions received from the memory controller 20. For example, the duplex ROD circuit 102 may receive commands that write register control words (RCWs). In various embodiments, the RCWs are implemented as configuration registers. In another example, the duplex RCD circuit 102 may receive commands for writing buffer control words (BCWs) to the duplex data buffers 104a-104n. The BCWs may be used to configure operations and parameters of the duplex data buffers. The duplex ROD circuit 102 may be configured to train the memory devices 106, the duplex data buffers 104a-104n and/or command and address lines connected to the memory controller 20. For example, the RCWs may flow from the memory controller 20 to the duplex RCD circuit 102. The RCWs may be used to configure the duplex RCD circuit 102. The BCWs may flow from the memory controller 20 to the duplex RCD circuit 102 and from the RCD circuit 102 to the duplex data buffers 104a-104n.

In an example, the duplex RCD circuit 102 may implement a 32-bit 1:2 command/address register. The duplex RCD circuit 102 may support one or more at-speed buses 110. In an example, a BOOM bus 110a for channel 0 and BOOM bus 110b for channel 1 may be implemented between the duplex RCD circuit 102 and the duplex data buffers 104a-104n. The duplex RCD circuit 102 may implement automatic impedance calibration. The duplex RCD circuit 102 may implement command/address parity checking. The duplex RCD circuit 102 may control register RCW readback. The duplex RCD circuit 102 may implement a 1 MHz inter-integrated circuit ($I^2C$) bus (e.g., a serial bus). Inputs to the duplex RCD circuit 102 may be pseudo-differential using external and/or internal reference voltages. The clock outputs, command/address outputs, control outputs and/or data buffer control outputs of the duplex RCD circuit 102 may be enabled in groups and independently driven with different strengths.

The duplex RCD circuit 102 may receive the signal CLK and/or the signals ADDR/CMD from the memory controller 20. Various digital logic components of the duplex RCD circuit 102 may be used to generate signals based on the signal CLK and/or the signals ADDR/CMD and/or other signals (e.g., RCWs). The duplex RCD circuit 102 may also be configured to generate a clock signal and address/command signals related to each channel for controlling accesses to the memory devices 106. For example, the clock signal may be implemented in compliance with a signal Y_CLK in the DDR4 specification. The clock signal and/or the address/command signals related to each channel may be presented to each of the memory devices 106 associated with the respective memory channels (e.g., on a number of common busses). The duplex RCD circuit 102 may generate one or more data buffer control signals (e.g., DBC). The signals DBC may be presented to each of the duplex data buffers 104a-104n. The signals DBC may be transmitted on a single common bus 110 (e.g., a data buffer control bus) or on respective buses 110a and 110b for each channel.

The duplex data buffers 104a-104n may be configured to receive data from the bus 110 (e.g., described below in connection with FIG. 8) or from the buses 110a and 110b (e.g., described below in connection with FIG. 7). The duplex data buffers 104a-104n may be configured to generate/receive data signals (e.g. DQ) to/from the channels CH0 and CH1 . The channels CH0 and CH1 may comprise traces, pins and/or connections between the memory controller 20 and the duplex data buffers 104a-104n. The duplex data buffers 104a-104n may be configured to buffer data on the channels CH0 and CH1 for write operations (e.g., data transfers from the memory controller 20 to the corresponding memory devices 106). The duplex data buffers 104a-104n may be configured to buffer data on the channels CH0 and CH1 for read operations (e.g., data transfers from the corresponding memory devices 106 to the memory controller 20). The duplex data buffers 104a-104n generally limit the loading on the channel signals, allowing increased signaling speeds at a given memory technology node.

Each of the duplex data buffers 104a-104n may have a first input/output 111 that communicates respective data signals DQ to/from the memory controller 20 on the first channel CH0, a second input/output 112 that communicates respective data signals DQ to/from the memory controller 20 on the second channel CH1, a third input/output 113 that communicates respective data signals DQ to/from the memory devices 106 associated with the first channel CH0, and a fourth input/output 114 that communicates respective data signals DQ to/from the memory devices 106 associated with the second channel CH1. In an example, each of the input/outputs 111, 112, 113, and 114 may be implemented as 4-bit wide data paths. Each of the duplex data buffers 104a-104n may also have a single connection to the bus 110 or respective connections to buses 110a and 110b, allowing the duplex data buffers 104a-104n to be configured in the appropriate mode for the memory topology of the system in which the memory module 100 is installed.

Figure 7:
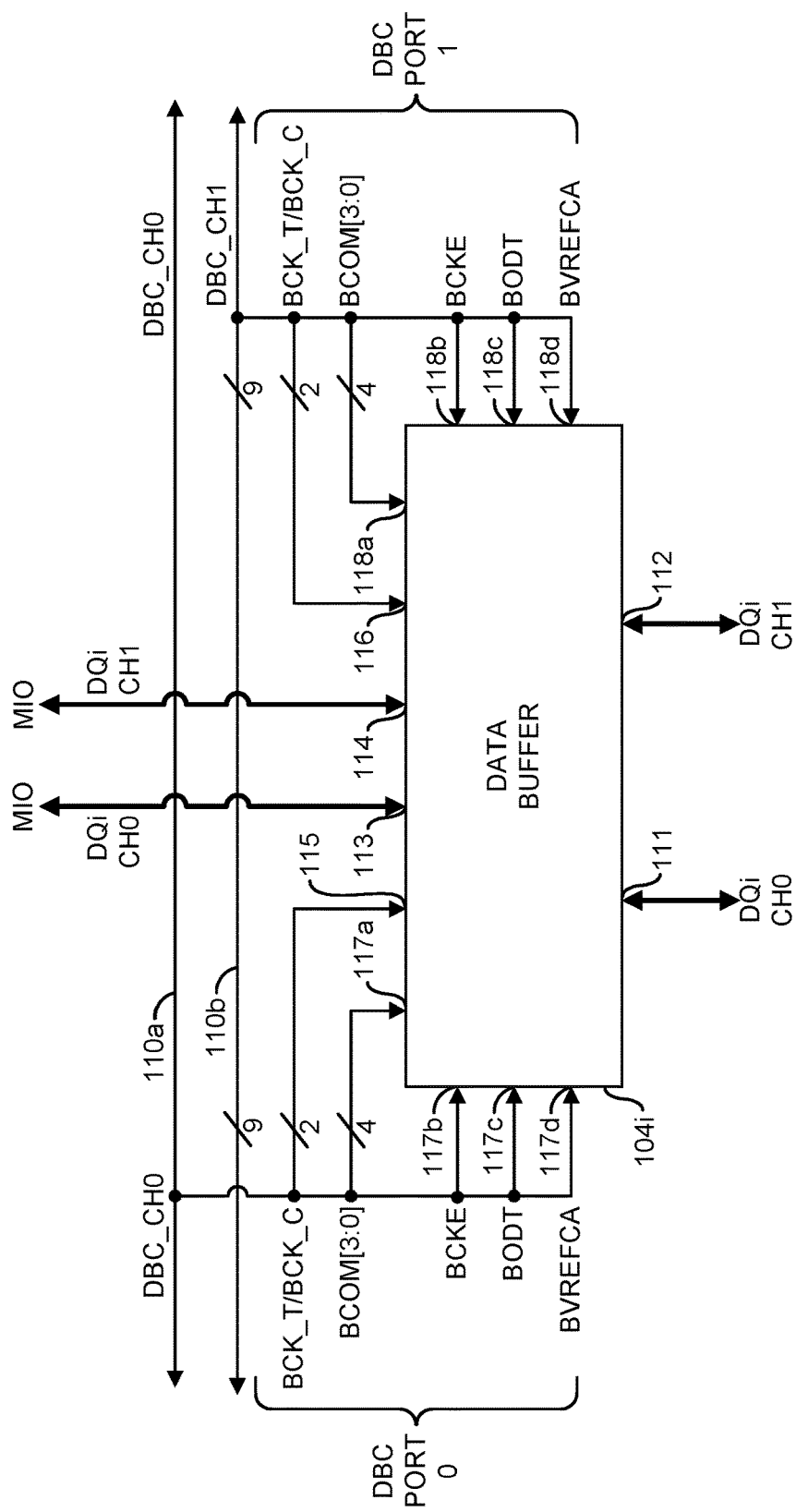
FIG. 7 is a diagram illustrating a duplex data buffer in accordance with an example embodiment of the invention.

Referring to FIG. 7, a diagram is shown illustrating a duplex data buffer 104i in accordance with an example embodiment of the invention. The duplex data buffer 104i may be representative of an example embodiment of the duplex data buffers 104a-104n. The duplex data buffer 104i is shown having a first input/output 111, a second input/output 112, a third input/output 113, and a fourth input/output 114.

The first input/output 111 is configured for presenting/receiving the signals DQi CH0 (e.g., the data signals DQ corresponding to memory channel CH0) between the duplex data buffer 104i and the controller 20. The second input/output 112 is configured for presenting/receiving the signals DQi CH1 (e.g., the data signals DQ corresponding to memory channel CH1) between the duplex data buffer 104i and the controller 20. The third input/output 113 is configured for presenting/receiving the signals DQi CH0 as memory input/output (MIO) signals corresponding to memory channel CH0 between the duplex data buffer 104i and the respective memory devices (e.g., DRAM chips) 106. The fourth input/output 114 is configured for presenting/receiving the signals DQi CH1 as memory input/output (MIO) signals corresponding to memory channel CH1 between the duplex data buffer 104i and the respective memory devices (e.g., DRAM chips) 106.

The signals MIO are generally transmitted between the memory modules 106 and the respective duplex data buffer 104a-104n. In an example, data (e.g., the signals DQi) from each channel of the memory controller 20 may be presented to the duplex data buffer 104i, buffered in the duplex data buffer 104i, then transmitted to the respective memory device(s) 106. In another example, data from the respective memory device(s) 106 may be presented to the duplex data buffer 104i, buffered in the duplex data buffer 104i, and then transmitted on an appropriate memory channel to the memory controller 20.

The duplex data buffer 104i is shown also receiving signals (e.g., DBC_CH0) from the bus 110a at a first control port (e.g., DBC PORT 0) and signals (e.g., DBC_CH1) from the bus 110b at a second control port (e.g., DBC PORT 1). The signals DBC CH0 and DBC_CH1 may be presented to each of the duplex data buffers 104a-104n (e.g., using the data buffer control buses 110a and 110b). In an example, the signals DBC_CH0 and DBC_CH1 are illustrated comprising five signals transmitted over 9 pins/bits (e.g., a pair of signals BCK_T/BCK_C, a signal BCOM, a signal BCKE, a signal BODT and/or a signal BVREFCA). However, other numbers of pins/bits may be implemented accordingly to meet the design criteria of a particular application. The first control port of the duplex data buffer 104i is shown having an input 115 receiving the signals BCK_T/BCK_C, an input 117a receiving the signal BCOM, an input 117b receiving the signal BCKE, an input 117c receiving the signal BODT, and an input 117d receiving the signal BVREFCA, all corresponding to channel 0 (CH0). The second control port of the duplex data buffer 104i is shown having an input 116 receiving the signals BCK_T/BCK_C, an input 118a receiving the signal BCOM, an input 118b receiving the signal BCKE, an input 118c receiving the signal BODT, and an input 118d receiving the signal BVREFCA, all corresponding to channel 1 (CH1).

In various embodiments, the signals BCK_T/BCK_C may be implemented as a 2-bit signal representing a differential (e.g., true (T) and complementary (C) versions) clock signal for the duplex data buffers 104a-104n. In various embodiments, the signal BCOM may be implemented as a 4-bit signal representing data buffer commands. The signal BCOM may be implemented as a unidirectional signal from the duplex RCD circuit 102 to the duplex data buffers 104a-104n. In an example, the signal BCOM may be implemented at a single data rate (e.g., 1 bit per signal per clock cycle). However, a particular command may take a different number of clock cycles to transfer information. The signal BCKE may be a function registered dedicated non-encoded signal (e.g., DCKE). The signal BODT may be a function registered dedicated non-encoded signals (e.g., DODT). The signal BVREFCA may be a reference voltage for use with pseudo-differential command and control signals.

Each channel of the duplex data buffers 104a-104n may receive a set of duplex data buffer commands (e.g., for writing buffer control words (BCWs)) from the signals DBC. The buffer control words may be used to customize operation of the respective channel of the duplex data buffers 104a-104n. The buffer control words may flow from the memory controller 20, through the duplex RCD circuit 102, to the duplex data buffers 104a-104n. The buffer control words may be similar to register control words (RCWS) used for configuring the duplex RCD circuit 102. Similar to commands for writing the register control words, the commands for writing the buffer control words may look like an MRS7 command, where the address lines are really the payload.

In embodiments where the buses 110, 110a, and/or 110b comprise nine pins, the duplex RCD circuit 102 may do more than pass a buffer control word directly through to the duplex data buffers 104a-104n. In one example, the duplex RCD circuit 102 may convert (e.g., multiplex) an MRS7 command format into a buffer control word in a BCOM format. The duplex RCD circuit 102 may map the 12 address bits of the MRS7 command into five separate data transfers, each 4 bits wide. The five data transfers may be set up back to back over one of the buses 110, 110a, or 110b. For example, 5 clock cycles plus a parity cycle may be used to complete the buffer command in the buffer control word. Once the buffer control word reaches the duplex data buffers 104a-104n, the duplex data buffers 104a-104n may decode the buffer control word, write the buffer control word to a function space of the duplex data buffer, and complete the buffer command in the buffer control word.

A function of the signal BOOM may be to transmit the buffer control words. However, compliant with the JEDEC specification for DDR4 SDRAM, the duplex RCD circuit 102 may send all read/write commands and MRS information over the bus 110, or buses 110a and 110b (e.g., to allow the duplex data buffers 104a-104n to keep track of what the memory devices 106 are doing). In some embodiments, different buffer commands may take a different number of cycles to transfer the information.

The duplex RCD circuit 102 may receive an MRS7 command from the memory controller 20 (e.g., from a host). For example, a host may want to change a parameter (e.g., typically on boot up of a computing device). The duplex RCD circuit 102 may check the MRS7 command to determine whether the address bit 12 is set to 1 (e.g., a logical one). In an example, when an address bit 12 of the MRS7 command is set to 1, the duplex RCD circuit 102 may recognize the command as a buffer command (e.g., a command that is not meant for the duplex RCD circuit 102). The duplex RCD circuit 102 may convert the command from the memory controller 20 to a buffer control word and send the buffer control word to the duplex data buffers 104a-104n via the bus 110. The duplex data buffers 104a-104n may write the buffer control word to a function space to complete the buffer command.

The duplex data buffers 104a-104n may be configurable. The buffer commands may allow the memory controller 20 to customize aspects of termination (e.g., ODT), signal strength on the DQ lines, and/or events (e.g., receiver timing, driver timing, etc.) in both directions (e.g., for both read and write operations). In some embodiments, some of the configurations of the duplex data buffers 104a-104n may be decided based on system level configurations. Generally, most of the configuration of the duplex data buffers 104a-104n may be decided during training steps. During training steps, host controllers (e.g., the memory controller 20) may test and compare results of various training steps to determine an optimal configuration.

In various embodiments, the bus 110 may be used to send commands/data to program configuration registers of the duplex data buffers 104a-104n. The bus 110 may also send commands (e.g., data reads and/or data writes) that control data traffic through the duplex data buffers 104a-104n. For example, some commands may optimize power consumption of the duplex data buffers 104a-104n. In another example, read/write delays may be added per data line.

The duplex data buffers 104a-104n may implement dual multi-bit (e.g., 4-bit) bidirectional data registers with differential data strobes (e.g., DQS_T/DQS_C). The duplex data buffers 104a-104n may implement automatic impedance calibration. The duplex data buffers 104a-104n may implement BCOM parity checking. The duplex data buffers 104a-104n may implement control register (e.g., buffer control word) readback.

Figure 8:
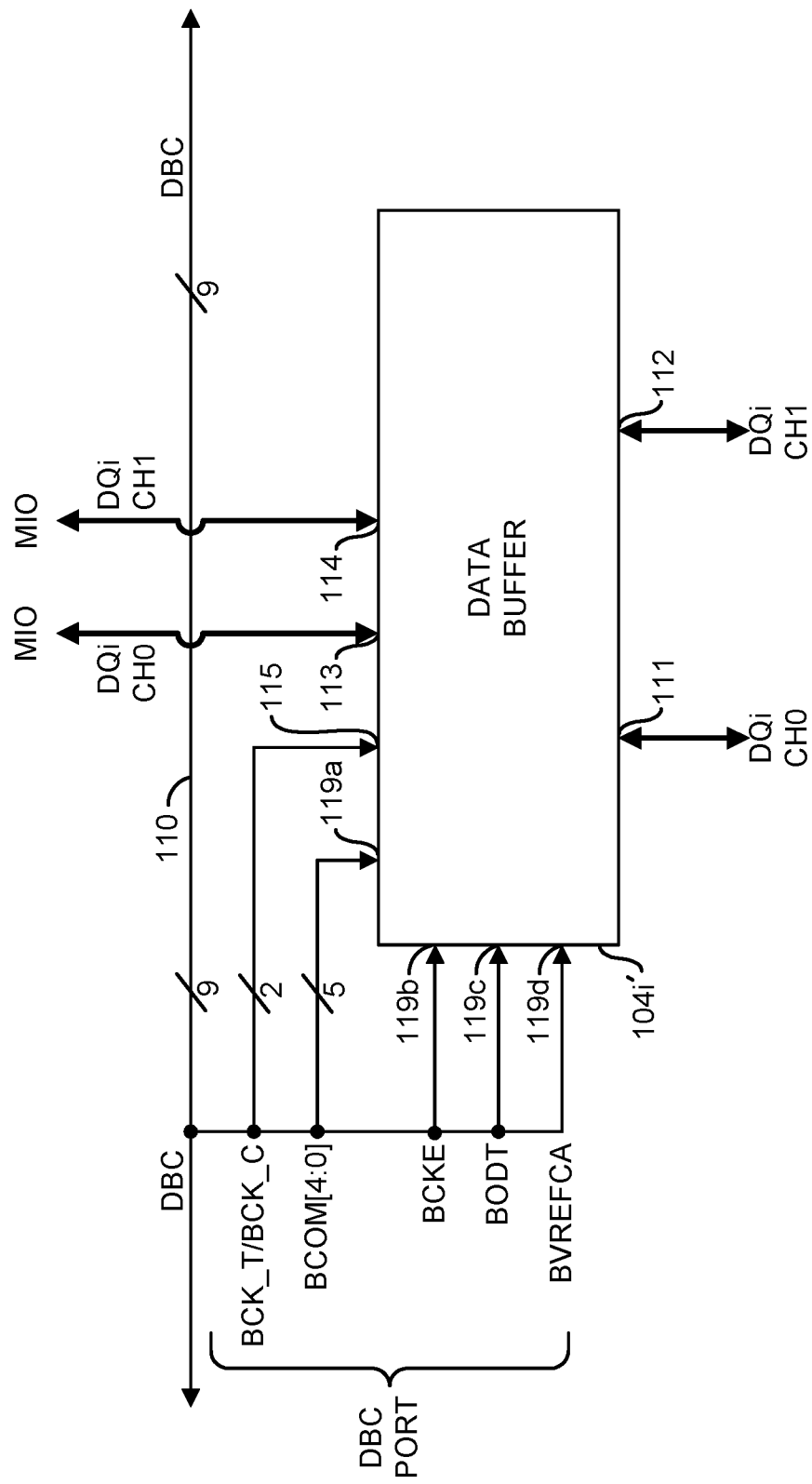
FIG. 8 is a diagram illustrating a duplex data buffer in accordance with another example embodiment of the invention.

Referring to FIG. 8, a diagram is shown illustrating a duplex data buffer 104i' in accordance with another example embodiment of the invention. In some embodiments, the duplex data buffer 104i' may be used to implement the duplex data buffers 104a-104n. The duplex data buffer 104i' may be implemented similarly to the duplex data buffer 104i, except that the duplex data buffer 104i' implements a single control port (e.g. DBC PORT) through which both sides of the duplex data buffer 104i' may be controlled.

In another example, the signals DBC may be implemented comprising the five signals BCK_T/BCK_C, BCOM, BCKE, BODT, and BVREFCA transmitted over 10 pins/bits (e.g., the signal BCOM may be implemented with 5 bits instead of 4 bits). However, other numbers of pins/bits may be implemented accordingly to meet the design criteria of a particular application. The control port DBC PORT of duplex data buffer 104i' is shown having an input 115 receiving the signals BCK_T/BCK_C, an input 119a receiving the signal BCOM, an input 119b receiving the signal BCKE, an input 119c receiving the signal BODT, and an input 119d receiving the signal BVREFCA. The control port DBC PORT is used to program operation of both channels of the duplex data buffer 104i'. In various embodiments, the signal BCOM may be implemented as a 5-bit signal communicating data buffer commands. The signal BCOM may be configured to signal which port of the duplex data buffer 104i' the signal BCOM is meant to control/program. The signal BCOM may be implemented as a unidirectional signal from the duplex RCD circuit 102 to the duplex data buffers 104a-104n. In an example, the signal BCOM may be implemented at a single data rate (e.g., 1 bit per signal per clock cycle). However, a particular command may take a different number of clock cycles to transfer information.

Figure 9A:
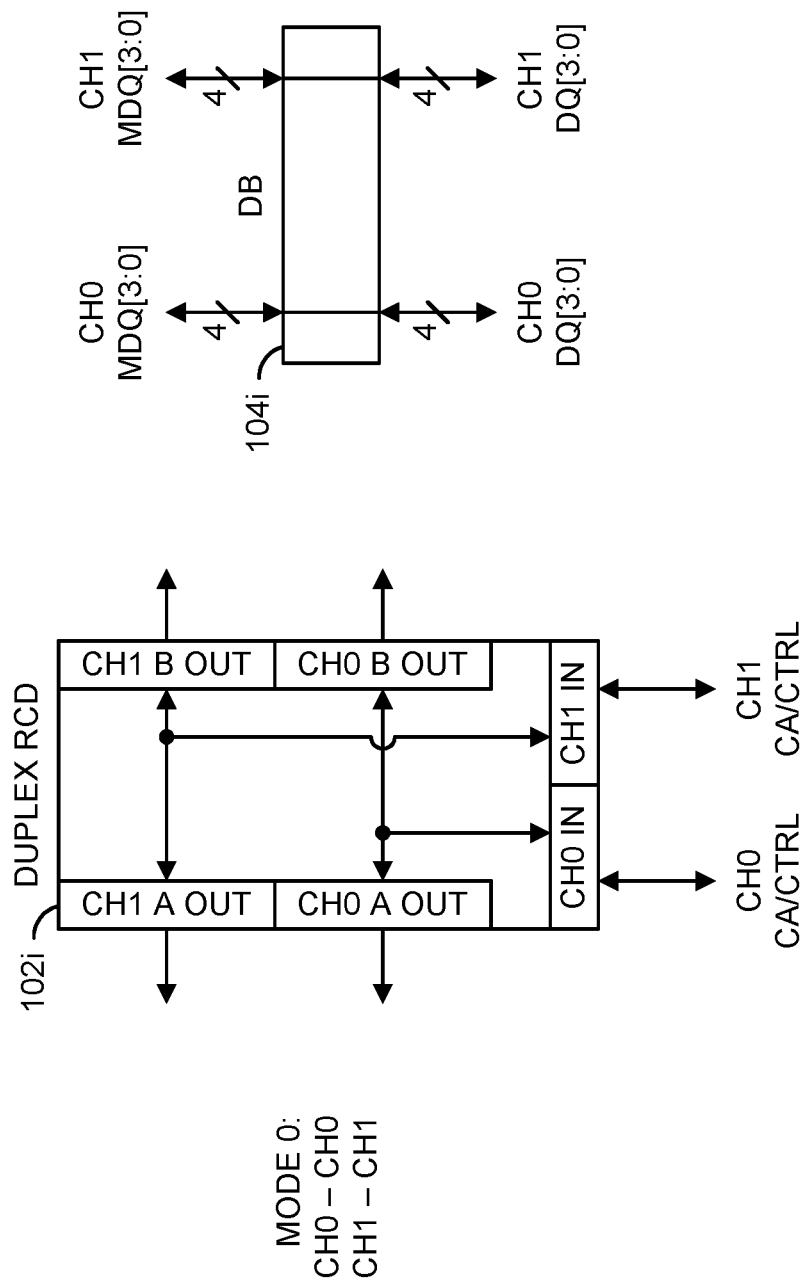
FIGS. 9A-9C are diagrams illustrating various operating modes of a duplex registered clock driver and a duplex data buffer in accordance with example embodiments of the invention.
Figure 9B:
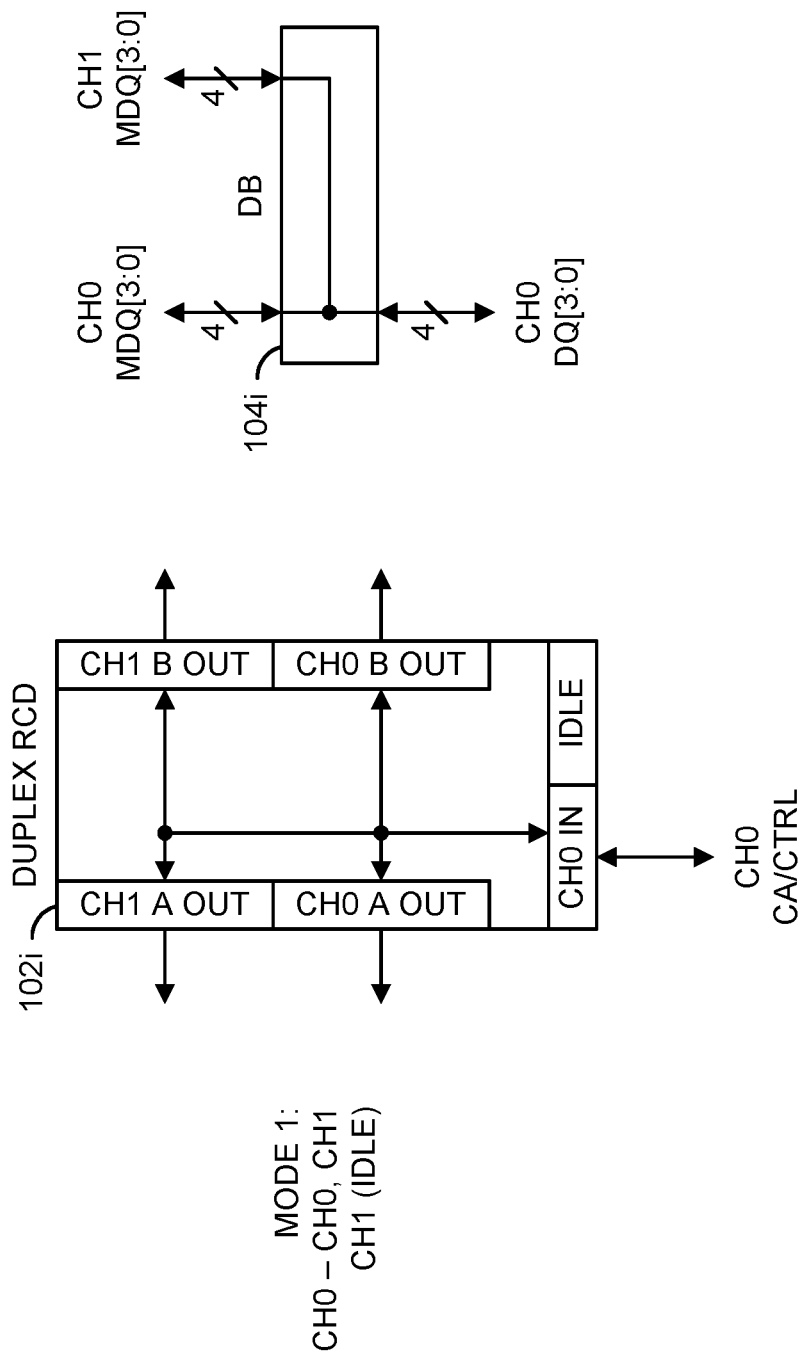
Figure 9C:
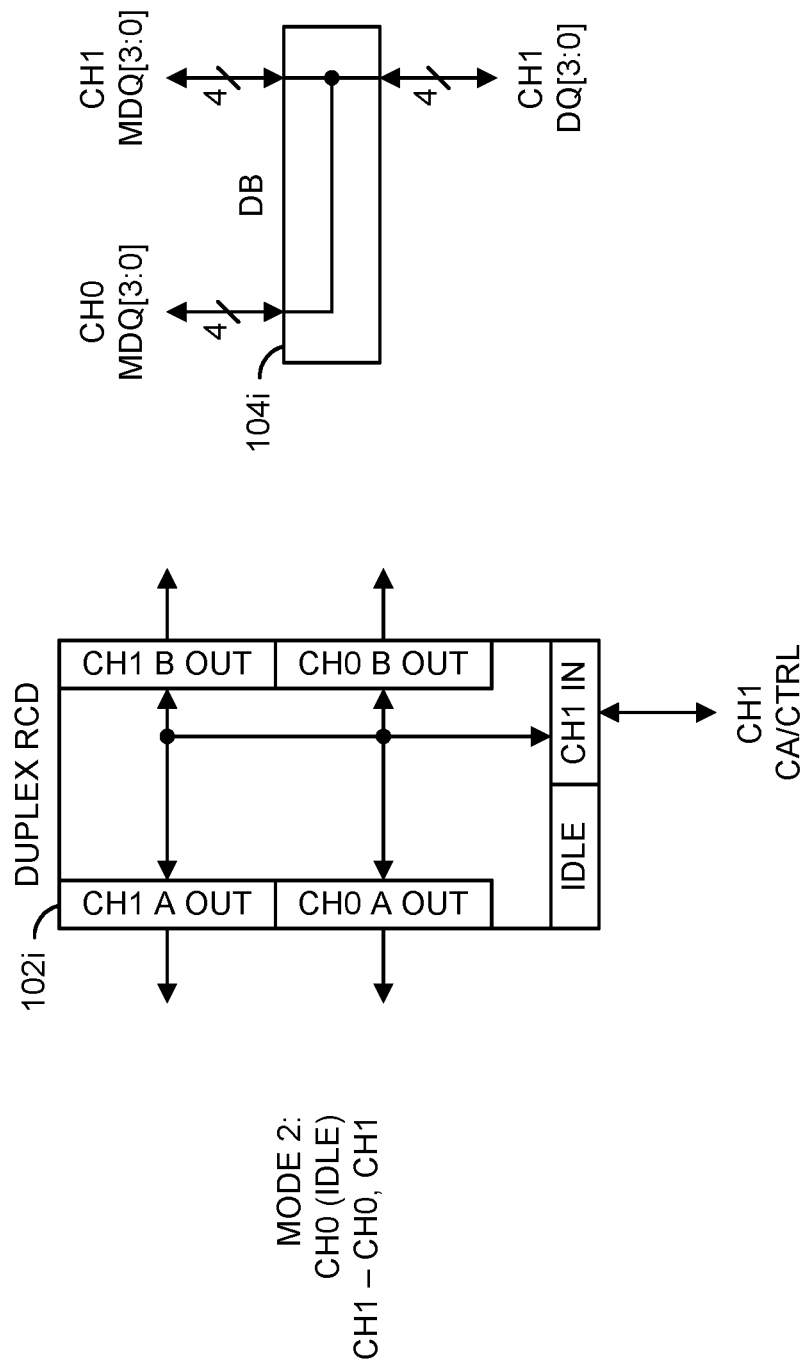

Referring to FIGS. 9A-9C, diagrams are shown illustrating various operating modes of the duplex registered clock driver 102 and the duplex data buffers 104a-104n in accordance with example embodiments of the invention. Referring to FIG. 9A, a diagram is shown illustrating a two-channel mode (e.g., MODE 0). In the two-channel mode, an exemplary duplex RCD circuit 102i and an exemplary duplex data buffer 104i are configured to service both channel 0 and channel 1 independently. Referring to FIG. 9B, a diagram is shown illustrating a first single-channel mode (e.g., MODE 1). In the first single-channel mode MODE 1, the duplex RCD circuit 102i and the duplex data buffer 104i (representing the duplex data buffers 104a-104n) are configured to communicate data to/from all of the memory devices 106 of the memory module using only channel 0. For example, the channel 1 bus side circuits are placed in the idle state and data to/from the memory devices 106 is routed to the channel 0 circuitry. Referring to FIG. 9C, a diagram is shown illustrating a second single-channel mode (e.g., MODE 2). In the second single-channel mode MODE 2, the duplex RCD circuit 102i and the duplex data buffer 104i are configured to communicate data to/from all of the memory devices 106 of the memory module using only channel 1. For example, the channel 0 bus side circuits are placed in the idle state and the data to/from the memory devices 106 is routed to the channel 1 circuitry.

Figure 10:
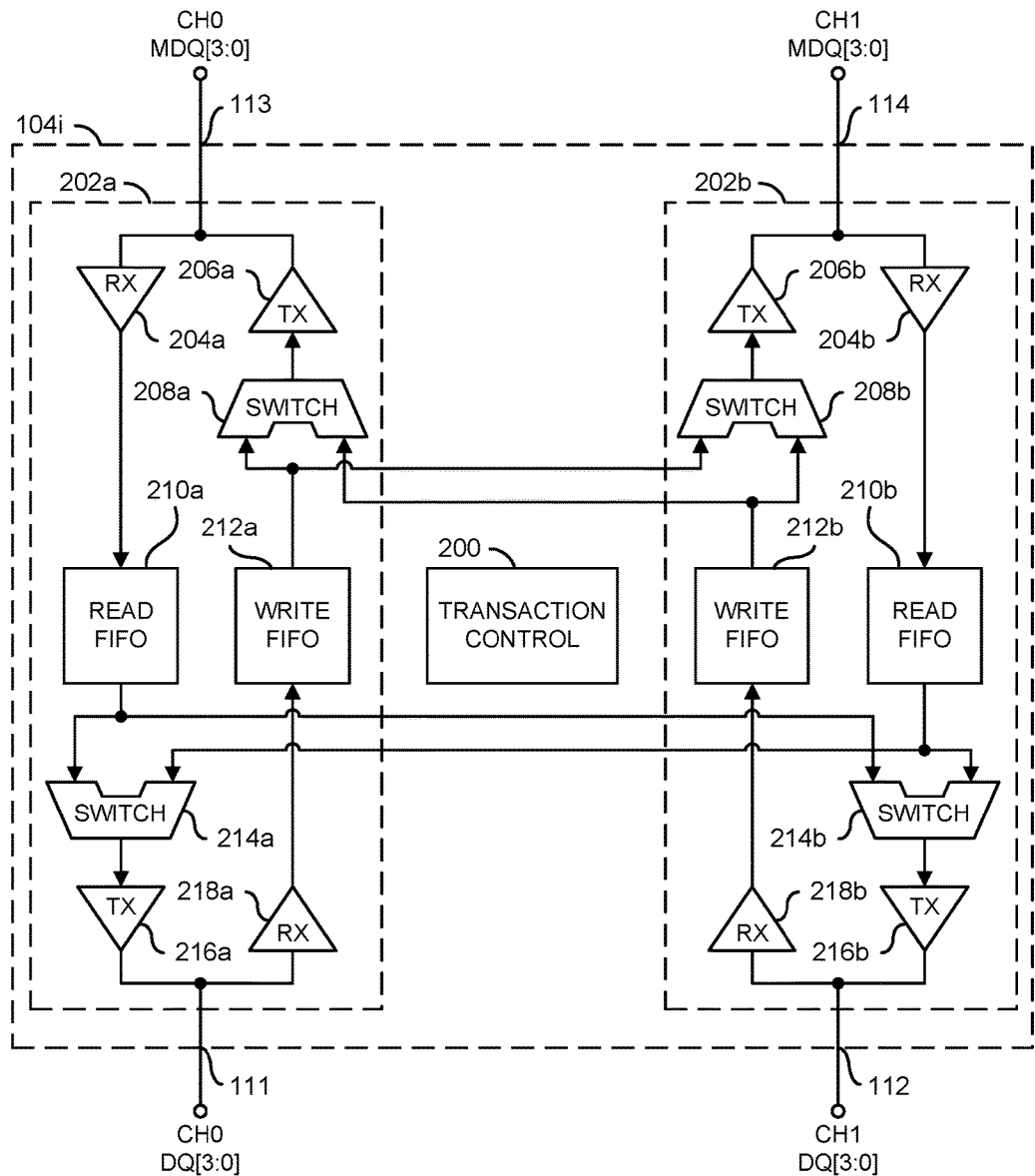
FIG. 10 is a diagram illustrating an example implementation of a duplex data buffer in accordance with an example embodiment of the invention.

Referring to FIG. 10, a diagram is shown illustrating an example implementation of a duplex data buffer 104*i* in accordance with an example embodiment of the invention. The duplex data buffers 104*a*-104*n* may be implemented as illustrated by the duplex data buffer 104*i*. In an example, the duplex data buffer 104*i* may comprise a block 200, a block 202*a* and a block 202*b*. The block 200 may implement a transaction control logic of the duplex data buffer 104*i*. The blocks 202*a* and 202*b* may implement channel circuitry for the duplex data buffer 104*i*. The block 200 may be configured to control operations of the duplex data buffer 104*i* based upon commands received via the bus 110 or the buses 110*a* and 110*b*. The circuit 200 is generally enabled to configure the circuit 202*a* and 202*b* for operation in either the two channel mode or one of the single channel modes described above in connection with FIGS. 9A-9C. The circuit 200 may be configured to implement the data buffer control (DBC) ports described above in connection with FIGS. 7 and 8.

In one example, the block 202*a* may be used to provide the channel 0 data path and the block 202*b* may be used to provide the channel 1 data path. In various embodiments, the block 202*a* may comprise a block (or circuit) 204*a*, a block (or circuit) 206*a*, a block (or circuit) 208*a*, a block (or circuit) 210*a*, a block (or circuit) 212*a*, a block (or circuit) 214*a*, a block (or circuit) 216*a*, and a block (or circuit) 218*a*. The block 202*b* may comprise a block (or circuit) 204*b*, a block (or circuit) 206*b*, a block (or circuit) 208*b*, a block (or circuit) 210*b*, a block (or circuit) 212*b*, a block (or circuit) 214*b*, a block (or circuit) 216*b*, and a block (or circuit) 218*b*. The blocks 204*a* and 204*b* may be implemented as receivers or buffers. The blocks 206*a* and 206*b* may be implemented as transmitters or buffer/drivers. The blocks 208*a*, 208*b*, 214*a*, and 214*b* may be implemented as switches. The blocks 210*a*, 210*b*, 212*a*, and 212*b* may be implemented as memories. The memories 210*a*, 210*b*, 212*a*, and 212*b* may be configured as first-in first-out (FIFO) memories. In some embodiments, the memories 210*a*, 210*b*, 212*a*, and 212*b* may be implemented as separate, independent memory blocks or devices. In some embodiments, the memories 210*a*, 210*b*, 212*a*, and 212*b* may be implemented as portions of a single memory block or device. The blocks 216*a* and 216*b* may be implemented as transmitters or buffer/drivers. The blocks 218*a* and 218*b* may be implemented as receivers or buffers.

In one example, the input/output 113 may be connected to an input of the block 204*a* and the output of the block 206*a*. The input/output 114 may be connected to an input of the block 204*b* and the output of the block 206*b*. An output of the block 204*a* may be connected to an input of the block 210*a*. An output of the block 204*b* may be connected to an input of the block 210*b*. An input of the block 206*a* may be connected to an output of the block 208*a*. An input of the block 206*b* may be connected to an output of the block 208*b*. A first input of the block 208*a* may be connected to a first input of the block 208*b* and an output of the block 212*a*. A second input of the block 208*a* may be connected to a second input of the block 208*b* and an output of the block 212*b*.

An output of the block 210*a* may be connected to a first input of the block 214*a* and a first input of the block 214*b*. An output of the block 210*b* may be connected to a second input of the block 214*a* and second input of the block 214*b*. An output of the block 214*a* may be connected to an input of the block 216*a*. An output of the block 218*a* may be connected to an input of the block 212*a*. An output of the block 216*a* and an input of the block 218*a* may be connected to the input/output 111. An output of the block 218*b* may be connected to an input of the block 212*b*. An output of the block 216*b* and an input of the block 218*b* may be connected to the input/output 112.

Although embodiments of the invention have been described in the context of a DDR4 application, the present invention is not limited to DDR4 applications, but may also be applied in other high data rate digital communication applications where different transmission line effects, cross-coupling effects, traveling wave distortions, phase changes, impedance mismatches and/or line imbalances may exist. The present invention addresses concerns related to high speed communications, flexible clocking structures, specified command sets and lossy transmission lines. Future generations of DDR can be expected to provide increasing speed, more flexibility, additional commands and different propagation characteristics. The present invention may also be applicable to memory systems implemented in compliance with either existing (legacy) memory specifications or future memory specifications.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   a plurality of memory devices; and
   a control circuit comprising a duplex registered clock driver and a plurality of duplex data buffers, each configured to operate with two channels, said control circuit configured to enable a plurality of access modes for said plurality of memory devices, wherein (i) in a one-channel mode all of said memory devices are accessed using a single selectable channel, (ii) in a two-channel mode a first portion of said plurality of memory devices is accessed using a first channel and a second portion of said plurality of memory devices is accessed using a second channel, and (iii) each of said duplex data buffers comprises one or more control ports, a first input/output port for communicating with a system bus using said first channel, a second input/output port for communicating with said system bus using said second channel, a third input/output port for communicating with said first portion of said plurality of memory devices, and a fourth input/output port for communicating with said second portion of said plurality of memory devices.

2. The apparatus according to claim 1, wherein said plurality of memory devices and said control circuit are part of a double data rate (DDR) dual in-line memory module (DIMM).

3. The apparatus according to claim 2, wherein said plurality of memory devices and said control circuit are configured as a fourth generation double data rate (DDR4) dual in-line memory module (DIMM).

4. The apparatus according to claim 1, wherein:
   in said one-channel mode, accesses to all of said memory devices are managed by said duplex registered clock driver and said plurality of duplex data buffers using a single channel selected from said first and second channels; and
   in said two-channel mode, access to said first portion of said plurality of memory devices is managed by said duplex registered clock driver and a first portion of said plurality of duplex data buffers using said first channel and accesses to said second portion of said plurality of memory devices is managed by said registered clock driver and a second portion of said plurality of duplex data buffers using said second channel.

5. The apparatus according to claim 1, wherein said duplex registered clock driver and each of said plurality of duplex data buffers comprise separate circuitry for each channel.

6. The apparatus according to claim 1, wherein said duplex registered clock driver comprises a control port for said first channel, a control port for said second channel, one or more output ports for said first channel, and one or more output ports for said second channel.

7. The apparatus according to claim 6, wherein said one or more output ports for said first channel are connected to said first portion of said plurality of memory devices and said one or more output ports for said second channel are connected to said second portion of said plurality of memory devices.

8. The apparatus according to claim 1, wherein said duplex registered clock driver comprises a data buffer control port connected to each of said plurality of duplex data buffers by a single data buffer control bus.

9. The apparatus according to claim 1, wherein said duplex registered clock driver comprises a data buffer control port connected to each of said plurality of duplex data buffers by a first data buffer control bus connected to a first control port for commands related to said first channel and a second data buffer control bus connected to a second control port for commands related to said second channel.

10. The apparatus according to claim 1, wherein said duplex registered clock driver and each of said plurality of duplex data buffers are enabled to service each channel independently.

11. The apparatus according to claim 1, wherein said duplex registered clock driver and each of said plurality of duplex data buffers are enabled to selectively switch between three operating modes.

12. The apparatus according to claim 11, wherein:
in a first operating mode said duplex registered clock driver and each of said plurality of duplex data buffers facilitate communication with said plurality of memory devices using said first and second channels;
in a second operating mode, said duplex registered clock driver and each of said plurality of duplex data buffers facilitate communication between all of said plurality of memory devices and said first channel; and
in a third operating mode, said duplex registered clock driver and each of said plurality of duplex data buffers facilitate communication between all of said plurality of memory devices and said second channel.

13. The apparatus according to claim 12, wherein a portion of said duplex registered clock driver and a portion of each of said plurality of duplex data buffers associated with the channel not used for communication are placed in an idle state in said second and said third operating modes.

14. The apparatus according to claim 1, wherein each of said duplex data buffers comprises a first channel data path circuit, a second channel data path circuit, and a transaction control logic.

15. The apparatus according to claim 14, wherein said transaction control logic is configured to control operations of the duplex data buffer based upon commands received via said one or more control ports.

16. The apparatus according to claim 14, wherein said transaction control logic is enabled to configure said first channel data path circuit and said second channel data circuit for operation in either the two-channel mode or the one-channel mode using either said first channel or said second channel.

17. The apparatus according to claim 1, wherein:
said first channel data path circuit is coupled between said first input/output port and said third input/output port; and
said second channel data path circuit is coupled between said second input/output port and said fourth input/output port.

18. The apparatus according to claim 1, wherein said first channel data path and said second channel data path each comprise a write data path and a read data path.

19. The apparatus according to claim 18, wherein said first channel data path and said second channel data path each comprise a switch coupling said write data paths.

20. The apparatus according to claim 18, wherein said first channel data path and said second channel data path each comprise a switch coupling said read data paths.

* * * * *